United States Patent [19]

Koizumi et al.

[11] Patent Number: 5,841,809

[45] Date of Patent: Nov. 24, 1998

[54] ACCESS LINE TERMINATION UNIT

[75] Inventors: Nobukazu Koizumi; Yutaka Awata, both of Kawasaki, Japan

[73] Assignee: Fujitsu Limimited, Kanagawa, Japan

[21] Appl. No.: 763,831

[22] Filed: Dec. 11, 1996

[30] Foreign Application Priority Data

Jun. 3, 1996 [JP] Japan ................................. 8-140380

[51] Int. Cl.$^6$ .................................................. H03H 7/30
[52] U.S. Cl. ........................ 375/233; 379/410; 370/286
[58] Field of Search ................................. 375/231, 233, 375/232; 370/286, 289, 290, 292; 379/410, 411; 455/570

[56] References Cited

U.S. PATENT DOCUMENTS

| | | | |
|---|---|---|---|
| 5,157,690 | 10/1992 | Buttle | 375/232 |
| 5,481,564 | 1/1996 | Kakuishi et al. | 375/230 |
| 5,617,450 | 4/1997 | Kakuishi et al. | 375/230 |
| 5,675,612 | 10/1997 | Solve et al. | 375/326 |

*Primary Examiner*—Stephen Chin
*Assistant Examiner*—Albert Park
*Attorney, Agent, or Firm*—Helfgott & Karas, P.C.

[57] ABSTRACT

A post-cursor tap coefficient of a decision feedback equalizer is used as a coefficient of an echo canceler during a cold-start echo canceler training period in which a communication start-up training is carried out in an initial state and during a cold-start received signal detection period, so that an echo cancellation characteristic can be improved without increasing the circuit scale of the echo canceler and a high-speed, error-free received signal detection can be attained.

8 Claims, 14 Drawing Sheets

ACCESS LINE TERMINATION UNIT

BACKGROUND OF THE INVENTION

1. Field of the Invention

The present invention generally relates to termination circuits and, more particularly, to a line termination circuit in a digital access line transmission system.

2. Description of the Related Art

FIG. 1 shows a construction of a digital access line transmission system. A station is provided with an office channel unit (OCU) 10, and a subscriber is provided with a digital service unit (DSU) 11. The station and the subscriber are connected to each other by an access line 12.

The OCU 10 comprises a line termination circuit (LT) 15 coupled to the access line 12 and an interface circuit (CT) coupled to a switching unit 17. The DSU 11 comprises a line termination circuit (LT) 20 coupled to the access line 12 and user-network interface circuits CT 21 and INF 22 for subscriber terminals such as customer premise equipment 23.

ANSI (American National Standards Institute) T1.601 has standardized a basic rate (144 kbps) echo canceler digital access line transmission system. This standard prescribes a cold start in which a communication startup training is performed in an initial state where no filter factors are defined, and a warm start performed when the system is started for a second and subsequent times while the filter factor is maintained. FIG. 2 shows a communication startup training sequence. The sequence of FIG. 2 executed upon a cold start differs from that of a warm start only in training time. Referring to FIG. 2, upon receipt of a startup tone signal TL from LT 15 of the station, LT 20 of the subscriber sends a startup tone signal TN and a training random signal SN1 to LT 15. Upon detecting an end of the SN1, LT 15 sends training random signals SL1 and SL2 to LT 20. Upon receipt of SL1, LT 20 of the subscriber starts a training. Upon detecting SL2, LT 20 sends a training random signal SN2 to LT 15. When the training is completed, LT 20 sends a normal communication signal SN3 to LT 15. LT 15 of the station is required to receive SN2 at time T5 and LT 20 of the subscriber is required to receive SL1 at time T3.

FIG. 3 is a block diagram of a conventional line termination circuit coupled to an access line. Referring to FIG. 3, a transmission circuit (TX) 30 encodes transmitted data arriving via a terminal 31 using 2B1Q codes, and sends signals having four polarities ±1 and ±3 to the access line 12 via a hybrid circuit (HYB) 32. An A/D converter 33 is supplied with a received signal received via the access line 12 and an echo that has wrapped around the hybrid circuit 32. A digital signal output from the A/D converter 33 has an echo cancelled by an output from an echo canceler (EC) 35 using a subtracter 34.

The received signal having an echo removed is subject to circuit loss equalization by a circuit loss equalization filter (EQL) 37, wherein a circuit loss of the access line is equalized. The received signal is then supplied to a decision feed-back equalizer (DFE) 38 where intersymbol interferences are eliminated, and is subject to symbol determination. A reception symbol a obtained accordingly is output via a terminal 39. A digital phase locked loop (DPLL) 42 controls the phase of a transmission clock of the transmission circuit 30 and a sampling clock of the A/D converter 33, based on timing information extracted by the decision feedback equalizer 38. A received signal detection circuit (SDET) 40 compares an output signal of the echo canceler 35 with a threshold value and outputs a decision signal via a terminal 41.

FIG. 4 is a block diagram of the conventional received signal detection circuit 40. Referring to FIG. 4, a level decision logic circuit 46 compares a received signal output from the echo canceler 35 and supplied via a terminal 45 with a threshold value, and outputs a indication signal indicating whether the absolute level of the received signal exceeds or is below the threshold level. A protection counter 47 is reset when supplied with the indication signal indicating that the received signal is below the threshold value, and increments a clock CLK when supplied with the indication signal indicating the excess. When the count overflows, the protection counter 47 outputs a signal indicating a detection of the received signal via a terminal 48. An overflow signal can be used as a received signal detection signal by appropriately setting the threshold value, the count at which an overflow occurs (that is, the number of stages of protection). The protection counter 47 can be used both upon a cold start and a warm start.

FIG. 5 is an isolated wave response of the received signal. FIG. 6 is a block diagram of a conventional decision feedback equalizer 38. Tap coefficients $C_{-1}, C_0, C_1, \ldots C_M$ of the decision feedback equalizer 38 operate adaptively so that $C_{-1}, C_0, \ldots C_N$ of the isolated wave response are estimated. Referring to FIG. 5, the tap coefficients $C_1$–$C_M$ are referred to as post-cursors which produce intersymbol interferences R when convoluted with received signal symbols $a_1$–$a_M$ by multipliers 51–53 and an adder 55. The tap coefficient $C_0$ is referred to as a main cursor and used as a threshold value in reception symbol determination by a decision unit 57. The tap coefficient $C_{-1}$ is referred to as a pre-cursor and used as timing information of the received signal. The sampling phase of the A/D converter 33 is delayed when $C_{-1}$ is negative, and is advanced when $C_{-1}$ is positive.

The convolution operation by the multipliers 51–53 and the adder 55 is represented as per $$R = \sum_{n=1}^{M} C_n * a_n$$

Equalization operation by a mixer 58 is represented as per the following equation, where X indicates an output from the equalizer circuit 37 and supplied via a terminal 59, and Y indicates an output from the mixer 58.

$$Y = X - R$$

The decision logic of the decision unit 57 is given by

If $Y \geq 2*C_0$, then $a = +3$

If $2*C_0 > Y \geq 0$, then $a = +1$

If $0 > Y \geq -2*C_0$, then $a = -1$

If $-2*C_0 > Y$, then $a = -3$

Residual errors $e_1$ and $e_0$ output from mixers 61 and 62 are respectively given by $$e_1 = e_0 - a_0 * C_{-1}$$

$$e_0 = Y - a_0 * C_0$$

The tap coefficient $C_n$ (where n=−1 M) supplied to multipliers 63, 64 and 51–53 is given by the following equation, where α is a step size in updating.

$$C_n = C_n + \alpha * a_{n+1} * e_1$$

FIG. 7 shows an isolation wave response of the echo. FIG. 8 shows a block diagram of the conventional echo canceler 35. The tap coefficients $E_1$–$E_N$ of the echo canceler 35 adaptively operate to estimate $E_1$–$E_N$ of the isolated wave response. Echoes subsequent to $E_N$ of the isolated wave response are simulated by an exponential function which attenuates by a factor of $\tau$. Referring to FIG. 8, the tap coefficients $E_1$–$E_N$ are convoluted with transmission symbols $b_1$–$b_N$ so as to produce a first pseudo echo having large-amplitude portions. The trail of the exponentially attenuating echo is fed to an infinite impulse response (IIR) operator 70 for calculating a second pseudo echo. An echo replica produced by adding the first and second pseudo echoes together is output from the echo canceler 35. Convolution operation by multipliers 71–75 and an adder 77 is given by $$\text{echo replica} = \sum_{n=1}^{N} E_n * b_n + \tau * U$$

The tap coefficient $E_n$ (where n=1 –N) supplied to the multipliers 71–75 is given by the following equation, where $\beta$ is a step size in updating and $e_1$ is a residual error supplied by the decision feedback equalizer 38.

$$E_n = E_n + \beta * b_{n+1} * e_1$$

The trail U of the echo is given by the following equation, where $\tau$ indicates an attenuation rate.

$$U = \tau * U + E_N * b_N$$

Since the received signal arrives in a randomly convoluted state, it is necessary for the threshold value of the received signal detection circuit 40 to be set substantially lower than the actual received signal to cause the level of the received signal to exceed the threshold value in a stable manner. Since the threshold value of the level decision is fixed, the threshold value must be set so that the received signal carried on the maximum length of the access line 12 and suffering from the maximum loss can be detected. The received signal detection (time T3) by LT 20 of the subscriber is done when the subscriber does not send any signals. On the contrary, the received signal detection (time T5) by LT 15 of the station is done while the station is in the process of transmitting SL2 and the echo canceler 35 is in operation. Therefore, the echo canceler 35 must be designed so that a residual echo that remains after cancellation is always below the threshold value. In normal communication over the maximum length of the access line, the echo cancellation described above is necessary in order to secure appropriate communication quality (bit error rate). In the case of short-distance transmission, requirement for echo cancellation characteristic is not so strict because the loss in the received signal is small.

If the conventional received signal detection circuit is used, the same echo cancellation characteristic is required for long-distance transmission and short-distance transmission, causing the scale of the echo cancellation circuit to become large and complex.

One of the difficulties in the received signal detection operation in the station is that an arrival of the received signal is detected while the echo cancellation is being performed. For example, since a high-precision echo cancellation performance is required in the long-distance transmission, a parameter that produces an echo waveform simulated by an exponential function after $E_N$ as shown in FIG. 7 may be specified, producing an echo waveform having zero-cross points after $E_N$ as shown in FIG. 9 in the case of the near-distance transmission. Since the level of the received signal is relatively high in the near-distance transmission, no unfavorable effect is caused in the communication even if echoes that are not subject to equalization remain. In a cold-start, however, detection of the received signal occurs in a state in which the level thereof remains unknown. Therefore, it is likely that a residual echo may be detected as a received signal.

SUMMARY OF THE INVENTION

Accordingly, an object of the present invention is to provide access line termination units in which the aforementioned problems are eliminated.

Another and more specific object of the present invention is to provide an access line termination unit capable of error-free, high-precision detection of a received signal.

The aforementioned objects of the present invention can be achieved by a line termination circuit for an access line, comprising: an echo canceler for generating an echo replica from transmitted data; a subtracter for subtracting said echo replica from a signal supplied via the access line; an equalization filter for equalizing a circuit loss of the access line; a decision feedback equalizer for equalizing an output signal from said equalization filter so as to determine a reception symbol; and a received signal detection circuit for detecting a received signal, wherein a post-cursor tap coefficient of said decision feedback equalizer is used as a tap coefficient for said echo canceler during a cold-start echo canceler training period in which communication startup training is started in an initial start and during a cold-start received signal detection period.

According to the access line termination unit of the present invention, it is possible to improve the echo cancellation characteristic without increasing the circuit scale of an echo canceler and to detect a received signal with an error-free, high-precision performance.

In one preferred embodiment, an infinite impulse response operation of said echo canceler is halted during said cold-start echo canceler training period and said cold-start received signal detection period.

According to this aspect of the present invention, it is possible to prevent infinite impulse response operation from hindering an adaptive echo cancellation operation effected by a decision feedback equalizer using post-cursor tap coefficients.

In another preferred embodiment, a signal path bypasses said equalization filter during said cold-start echo canceler training period and said cold-start received signal detection period.

According to this aspect of the present invention, it is possible to prevent an equalization filter from hindering the echo cancellation adaptive operation effected by the decision feedback equalizer using the post-cursor tap coefficients.

In still another preferred embodiment, a post-cursor tap coefficient of said decision feedback equalizer is reset when the received signal is detected by said received signal detection circuit.

According to this aspect of the present invention, the post-cursor tap coefficients used in the echo cancellation adaptive operation is reset so that the operation intended to be performed by the decision feedback equalizer can be started without being affected by the echo cancellation operation.

In yet another preferred embodiment, said received signal detection circuit detects the received signal by comparing a main cursor tap coefficient output from said decision feedback equalizer during the cold-start received signal detection period with a threshold value.

According to this aspect of the present invention, since the main cursor tap coefficient increases in correspondence with an average signal power that provides a detection of the received signal, a reliable detection of the received signal is enabled.

Preferably, said threshold value of said received signal detection circuit is a fixed value that enables a level of a signal transmitted over a maximum length of the access line to be detected.

According to this aspect of the present invention, it is possible to detect a signal transmitted by a subscriber at an end of the maximum length of the line.

In still another preferred embodiment, the received signal is detected when the reception symbol determined by said decision feedback equalizer is found to be a predetermined value during a warm-start received signal detection period in which communication startup training is started while a filter factor is held.

According to this aspect of the present invention, since a residual echo that remains after the echo cancellation is smaller than the main cursor after the echo cancellation training is performed upon a warm start, it is possible to detect the received signal with a satisfactorily large margin by detecting that the reception symbol determined based on a reference level twice as high as the main cursor is at a predetermined level.

In yet another preferred embodiment of the present invention, convolution, equalization and tap coefficient updating operation of said decision feedback equalizer are halted during a warm-start echo canceler training period and the warm-start received signal detection period.

According to this aspect of the present invention, it is possible to prevent a signal level providing detection from being affected by post-cursor convolution and equalization operation so that the received signal can be detected accurately.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

Figure 10:
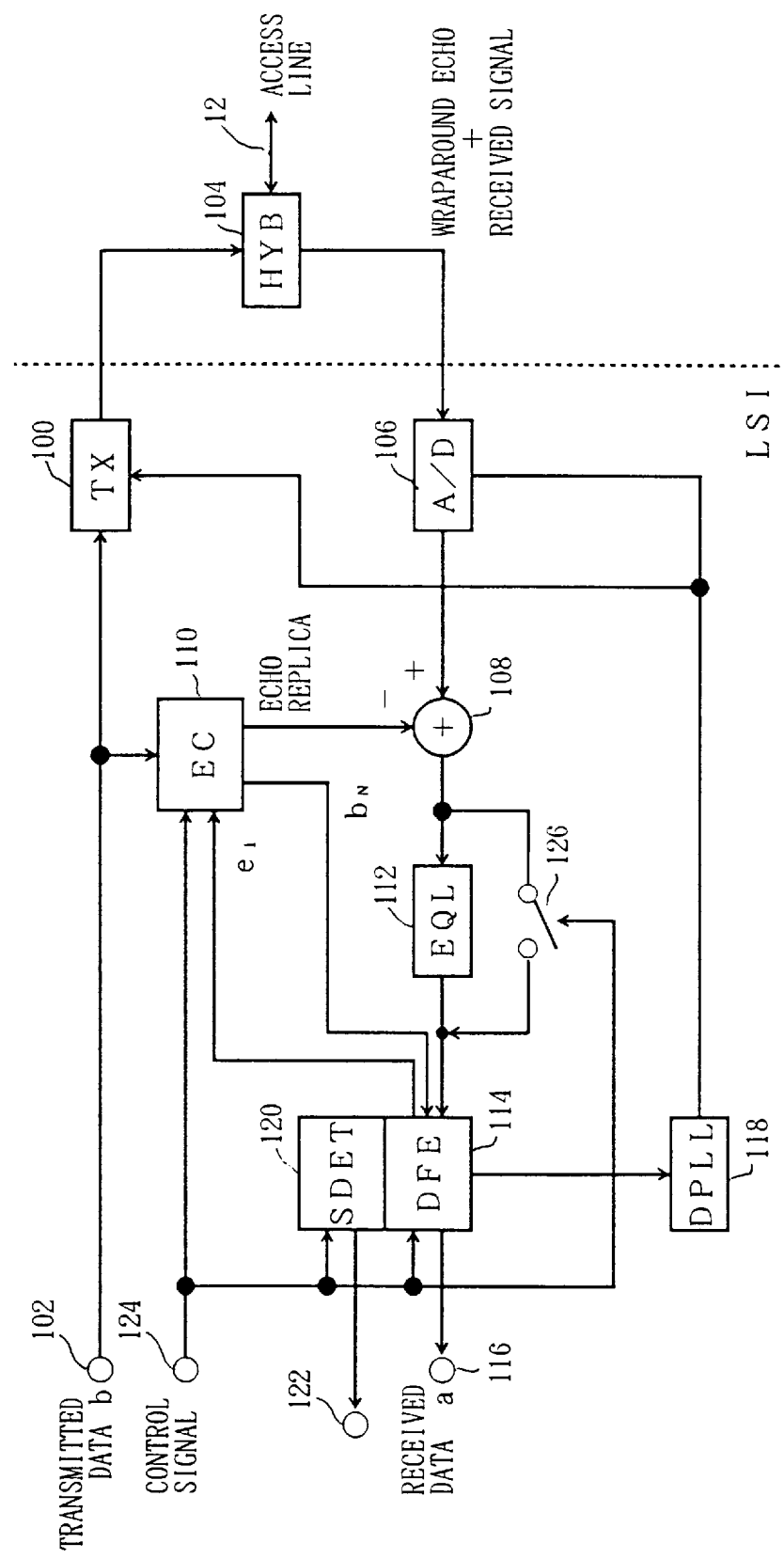
FIG. 10 is a block diagram of a line termination circuit of an access line according to a first embodiment of the present invention.

FIG. 10 is a block diagram of a line termination circuit for an access line according to a first embodiment of the present invention. Referring to FIG. 10, a transmission circuit (TX) 100 encodes transmitted data that arrives via a terminal 102 using 2BIQ codes and sends signals having four polarities ±1 and ±3 to the access line 12 via a hybrid circuit (HYB) 104. An A/D converter 106 is supplied with a received signal received via the access line 12 and an echo that has wrapped around the hybrid circuit 104. A digital signal output from the A/D converter 106 has an echo canceled by an output from an echo canceler (EC) 110 using a subtracter 108.

The received signal having an echo removed is subject to circuit loss equalization by a circuit loss equalization filter (EQL) 112, wherein a circuit loss of the access line is equalized. The received signal is then supplied to a decision feed-back equalizer (DFE) 114 where intersymbol interferences are eliminated, and is subject to symbol determination. A reception symbol a obtained accordingly is output via a terminal 116. A digital phase locked loop (DPLL) 118 controls the phase of a transmission clock of the transmission circuit 100 and a sampling clock of the A/D converter 106, based on timing information extracted by the decision feedback equalizer 114. A received signal detection circuit (SDET) 120 is supplied with a tap coefficient Go and a reception symbol a by the decision feedback equalizer 114 and determines, based on the tap coefficient and the reception symbol, whether or not a received signal has arrived. The received signal detection circuit (SDET) 120 outputs the result of determination via a terminal 122.

A residual error $e_1$ obtained in the decision feedback equalizer 114 is supplied to the echo canceler 110, which outputs a transmission symbol $b_N$ to the decision feedback equalizer 114. A switch 126 for bypassing the circuit loss equalization filter 112 is provided between an input terminal and an output terminal of the circuit loss equalization filter 112. The switch 126 is opened and closed by a control signal supplied via a terminal 124. The control signal supplied via the terminal 124 is also supplied to the echo canceler 110, the decision feedback equalizer 114 and the received signal detection circuit 120. The switch 126 is controlled by the control signal to be closed only in an echo canceler training sequence and a received signal detection sequence upon a cold start so that a residual echo that remains after the echo cancellation bypasses the circuit loss equalization filter 112 and is supplied to the decision feedback equalizer 114. On the other occasions, the switch 126 is open.

Referring to FIG. 10, all the circuits (100 and 106–108) except the hybrid circuit 104 are implemented by semiconductor integrated circuits.

Figure 11:
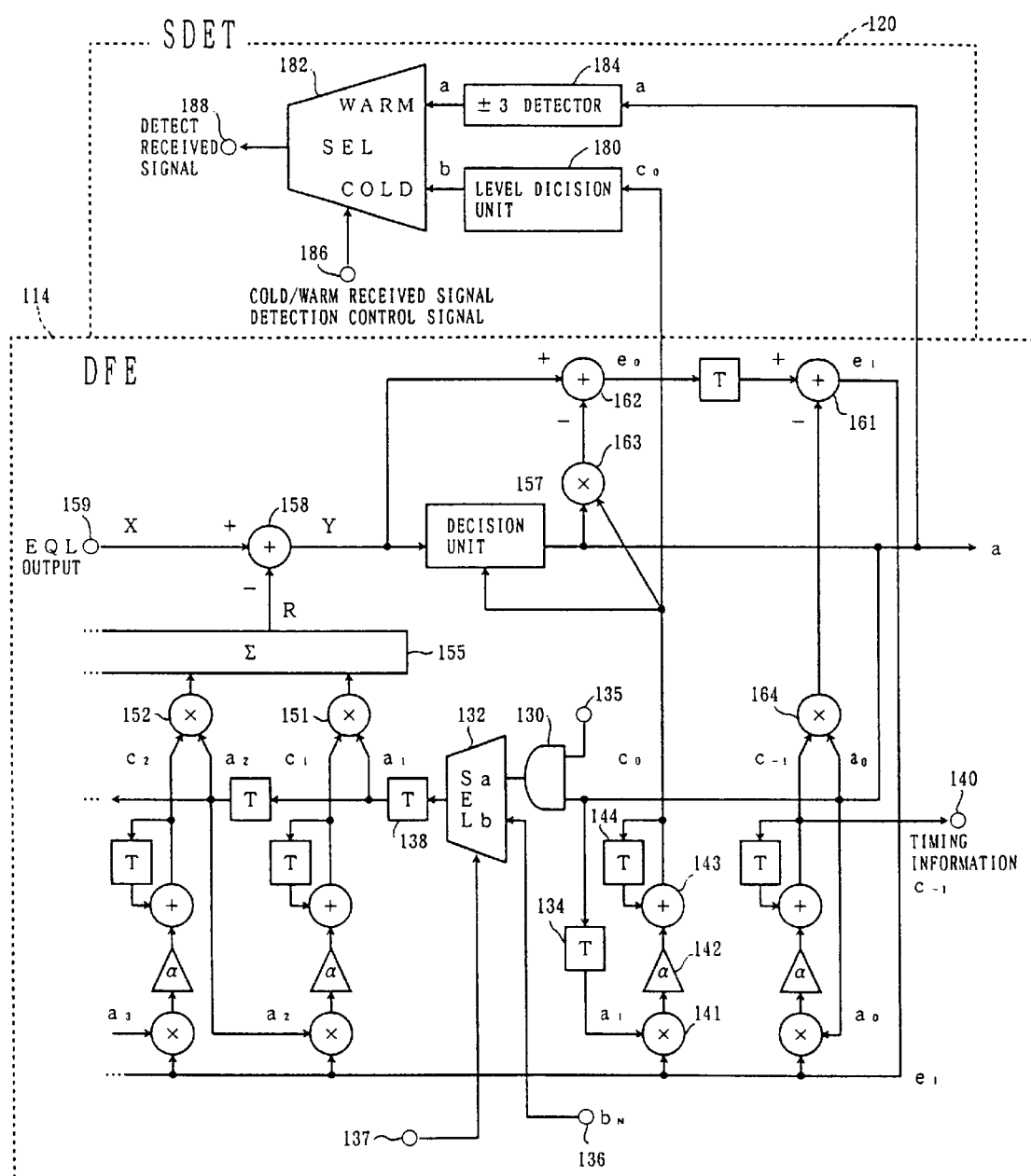
FIG. 11 is a block diagram of a decision feedback equalizer and a received signal detection circuit according to the present invention.

FIG. 11 is a block diagram of the decision feedback equalizer 114 and the received signal detection circuit 120. Referring to FIG. 11, the decision feedback equalizer 114 differs from the conventional decision feedback equalizer 38 in that there are provided an AND circuit 130 for halting the convolution of the post-cursors, a selector 132 for selecting whether an input symbol for convolution and updating of post-cursors is a decision value $a_0$ or a final symbol $b_N$ output from the echo canceler, and a unit delay element 134 as a register for holding the updating symbol $a_1$ of the main cursor.

Referring to FIG. 11, the tap coefficients $C_1$–$C_N$ are referred to as post-cursor tap coefficients or simply as post-cursors. The post-cursor tap coefficients produce intersymbol interferences R when convoluted with received signal symbols $a_1$–$a_M$ by multipliers 151–153 and an adder 155. The tap coefficient $C_0$ is referred to as a main cursor tap coefficient or simply as a main cursor and used as a threshold value in reception symbol determination by a decision unit 157. The tap coefficient $C_{-1}$ output via a terminal 140 is referred to as a pre-cursor tap coefficient or simply as a precursor and used as timing information of the received signal. The sampling phase of the A/D converter 106 is delayed when $C_{-1}$ is negative, and is advanced when $C_{-1}$ is positive.

The convolution operation by the multipliers 151–153 and the adder 155 is represented as per $$R = \sum_{n=1}^{M} C_n * a_n$$

Equalization operation by a mixer 158 is represented as per the following equation, where X indicates an output from the equalizer circuit 137 and supplied via a terminal 159, and Y indicates an output from the mixer 158.

$$Y = X - R$$

The decision logic of the decision unit 157 is given by

If $Y \geq 2*C_0$, then $a=+3$

If $2*C_0 > Y \geq 0$, then $a=+1$

If $0 > Y \geq -2*C_0$, then $a=-1$

If $-2*C_0 > Y$, then $a=-3$

Residual errors $e_1$ and $e_0$ output from mixers 161 and 162 are respectively given by $$e_1 = e_0 - a_0 * C_{-1}$$

$$e_0 = Y - a_0 * C_0$$

The tap coefficient $C_n$ (where n=$_{-1}$ M) supplied to multipliers 163, 164 and 151–153 is given by the following equation, where α is a step size in updating.

$$C_n = C_n + \alpha * a_{n+1} * e_1$$

For example, a unit for generating the tap coefficient $C_0$ comprises a multiplier 141 for performing the operation $a_1 * e_1$, a constant multiplier 142 for multiplying the updating step size α, a mixer 143 for adding an output of the constant multiplier 142 to an output of a unit delay element 144. Units for generating the other coefficients are constructed in the same manner.

The AND circuit 130 is supplied with a control signal which goes to state 0 only in the echo canceler training sequence and the received signal detection sequence upon a warm start. The AND circuit 130 supplies a symbol $a_0$ to a terminal a of the selector 132 except when the control signal is in a 0 state. A terminal b of the selector 132 is supplied with a final symbol $b_N$ output from the echo canceler via a terminal 136. The selector 132 is supplied via a terminal 137 with a control signal which goes to a 0 state only in the echo canceler training sequence and the received signal detection sequence upon a cold start. The selector 132 selects the final symbol $b_N$ when the control signal is in a 0 state. The selector 132 selects an output of the AND circuit 130 and supplies the same to a unit delay element 138 when the control signal is in a 1 state.

A level decision unit 180 in the received signal detection circuit 120 has a fixed threshold level that provides a detection of the level of the main cursor of the signal transmitted over the maximum length of the line. When the main cursor $C_0$ generated by the decision feedback equalizer 114 exceeds the above-mentioned threshold, the level decision unit 180 generates a detection signal indicating a detection of the received signal and feeds the detection signal to a terminal b of a selector 182. When the received signal detection sequence is started upon a cold start, the main cursor $C_0$ is set to 0. A ±3 detection unit 184 is supplied with a decision symbol a from the decision feedback equalizer 114. When the decision symbol is ±3 or −3, the ±3 detection unit 184 generates a detection signal indicating a detection of the received signal and supplies the detection signal to a terminal a of the selector 182.

The selector 182 is supplied via a terminal 186 with a control signal which goes to a 0 state upon a cold start and to a 1 state upon a warm start. The selector 182 selects an output signal of the level decision unit 180 upon a cold start. In a warm start, the selector 182 selects an output of the ±3 detection unit 184 and outputs a signal indicating a detection of the received signal.

Figure 12:
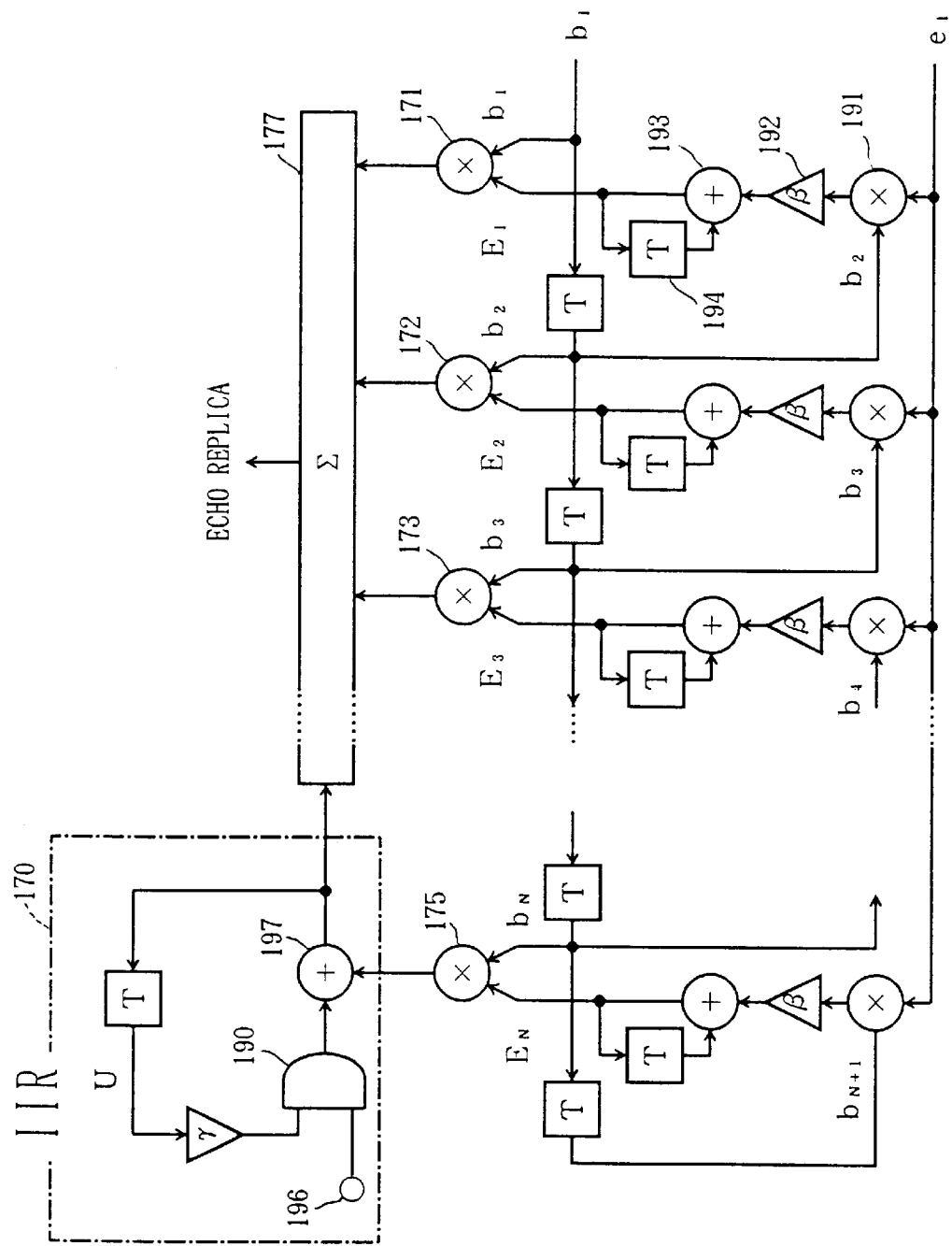
FIG. 12 shows a block diagram of an echo canceler according to the present invention.

FIG. 12 shows a block diagram of an echo canceler 110. The echo canceler 110 differs from the conventional echo canceler 35 in that an AND circuit 190 for halting the operation of an infinite impulse response (IIR) operator 170 is provided in the IIR operator 170.

Referring to FIG. 12, the tap coefficients $E_1$14 $E_N$ are convoluted with transmission symbols $b_1$–$b_n$ so as to produce a first pseudo echo having large-amplitude portions. The trail of the exponentially attenuating echo is fed to the IIR operator 170 for calculating a second pseudo echo. An echo replica produced by adding the first and second pseudo echoes together is output from the echo canceler 110.

Convolution operation by multipliers 171–175 and an adder 177 is given by $$\text{echo replica} = \sum_{n=1}^{N} E_n * b_n + \tau * U$$

The tap coefficient En (where n=1–N) supplied to the multipliers 171–175 is given the following equation, where β is a step size in updating and $e_1$ is a residual error supplied by the decision feedback equalizer 38.

$$E_n = E_n + \beta * b_{n+1} * e_1$$

The trail U of the echo is given by the following equation, where τ indicates an attenuation rate.

$$U = \tau * U + E_N * b_N$$

For example, an unit for generating the tap coefficient $E_1$ comprises a multiplier 191 for performing the operation $b_2 * e_1$, a constant multiplier 192 for multiplying an updating step size β and a mixer 193 for adding an output of the constant multiplier 192 to an output of a unit delay element 194. Units for generating the other coefficients are constructed in the same manner.

The AND circuit 190 is supplied with a control signal which goes to a 0 state only in an echo canceler training sequence and a received signal detection sequence upon a cold start. The AND circuit 190 allows the convolution operation by the IIR operator 170 to be performed when the control signal is in a 1 state and halts the convolution operation by the IIR operator 170 when the control signal is in a 0 state.

Figure 13:
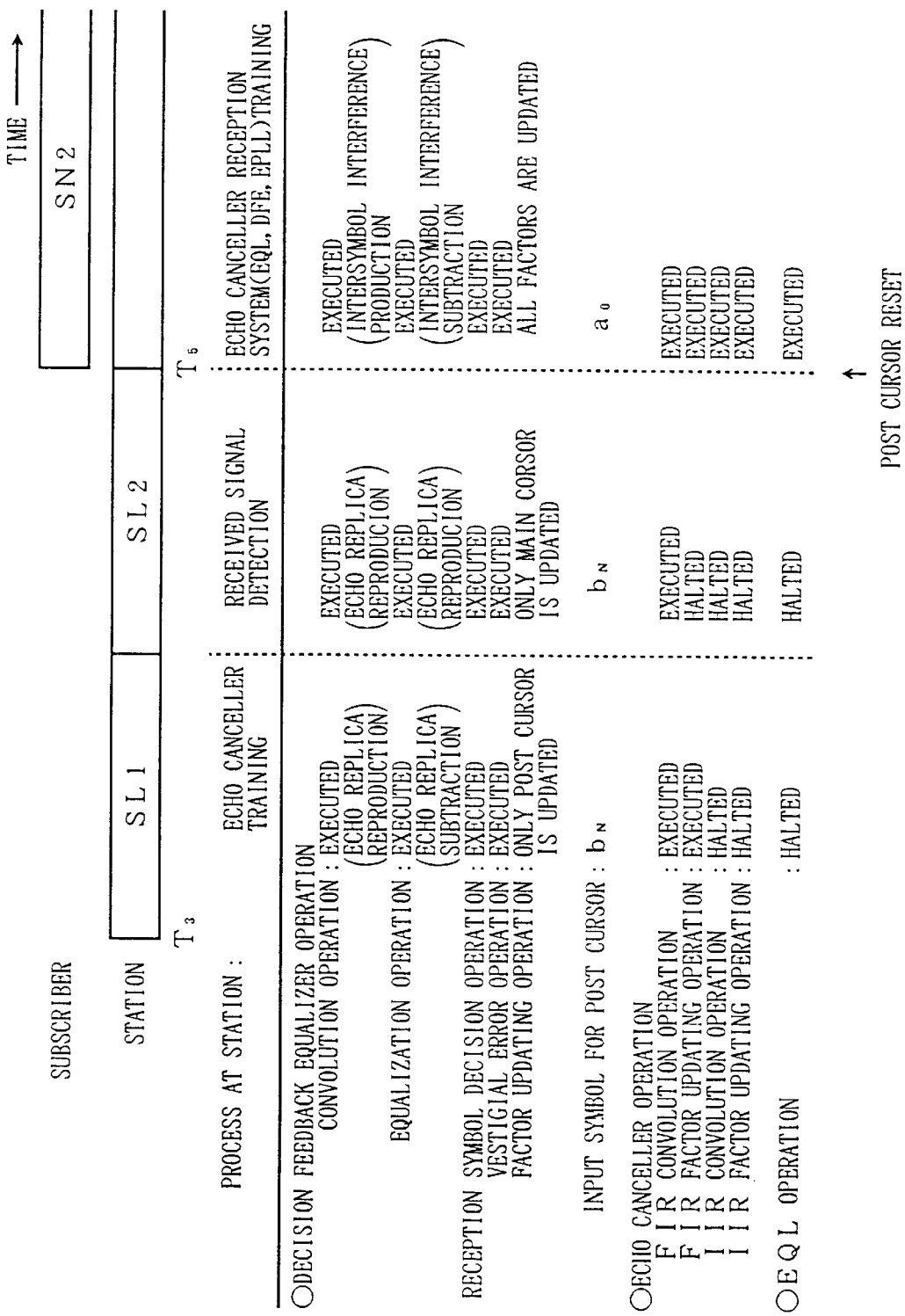
FIG. 13 shows a sequence of processes performed in the cold start in a line termination circuit of the station.

FIG. 13 shows a sequence of processes performed in a line termination circuit of the station upon a cold start. In the echo canceler training sequence and the received signal detection sequence executed upon transmitting of the training random signals SL1 and SL2, the decision feedback equalizer 114 does not perform any process. In this state, the units for generating the post-cursors $C_1$–$C_N$ in the decision feedback equalizer 114 are connected to the echo canceler 110 so as to generate the tap coefficients of the echo canceler 110. In this way, the echo cancellation performance is enhanced.

Figure 1:
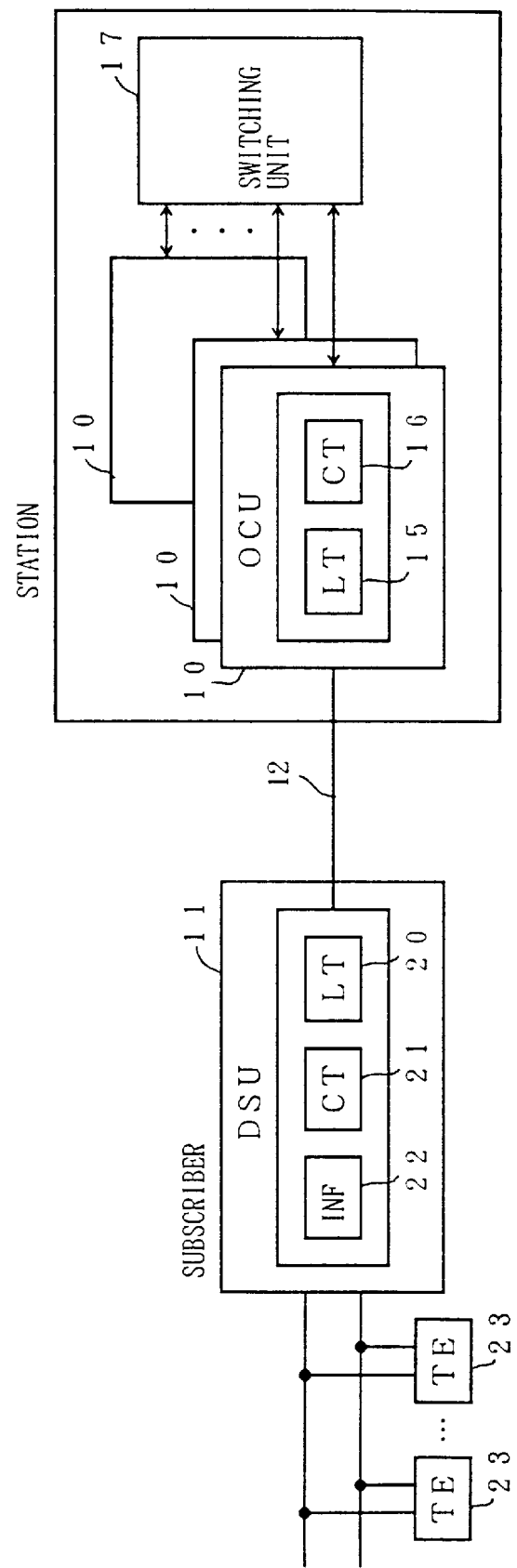
FIG. 1 shows a construction of a digital access line transmission system.
Figure 2:
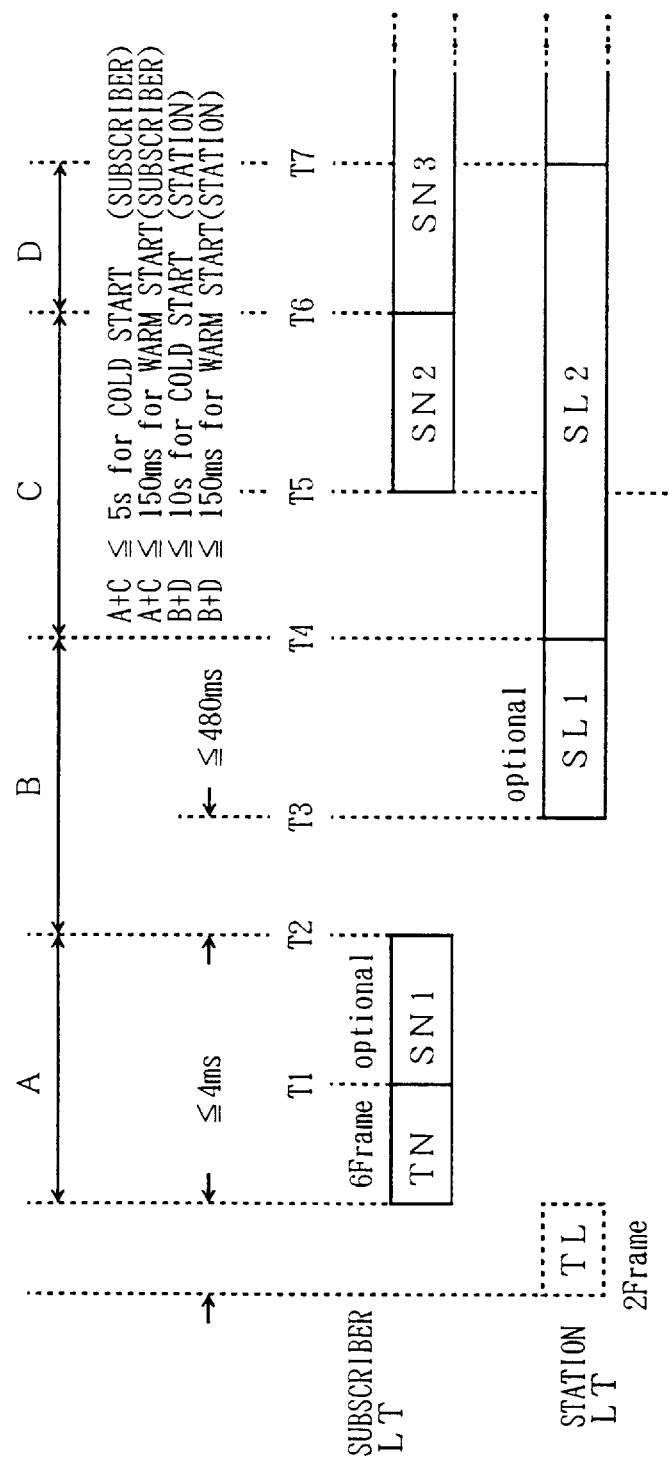
FIG. 2 shows a communication startup training sequence.
Figure 3:
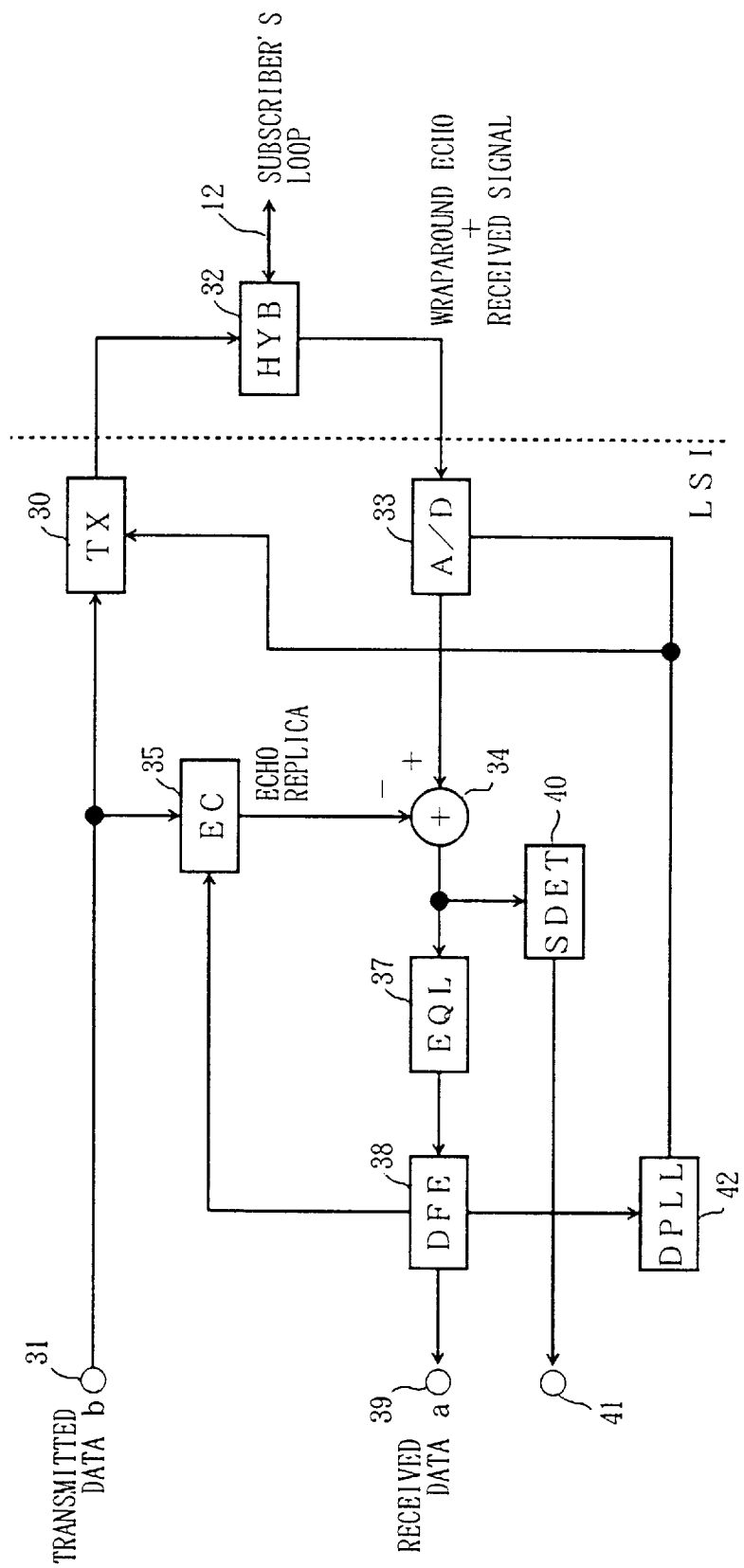
FIG. 3 is a block diagram of a conventional line termination circuit coupled to an access line.
Figure 4:
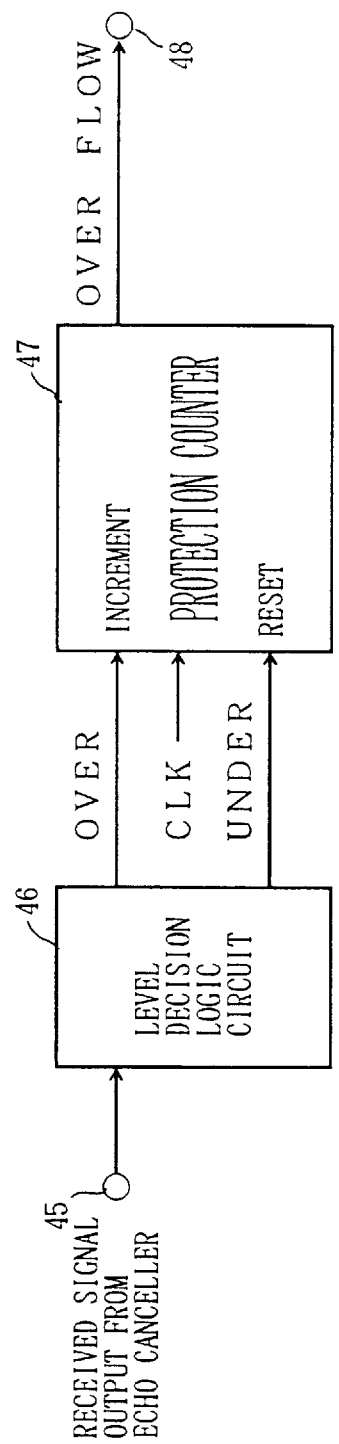
FIG. 4 is a block diagram of the conventional received signal detection circuit.
Figure 5:
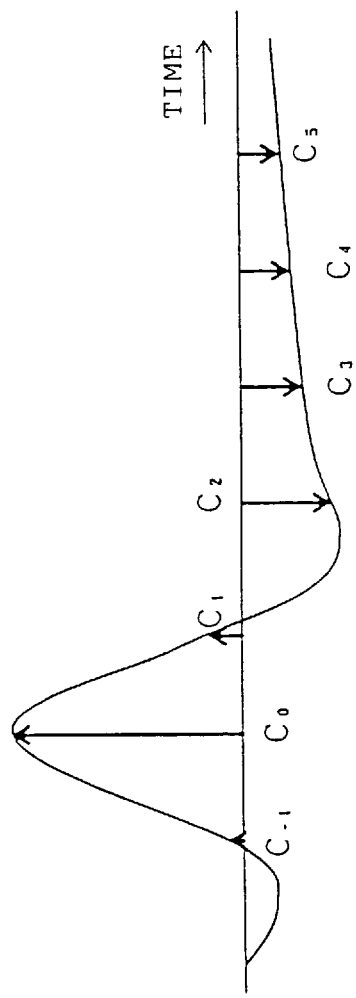
FIG. 5 is an isolated wave response of the received signal.
Figure 6:
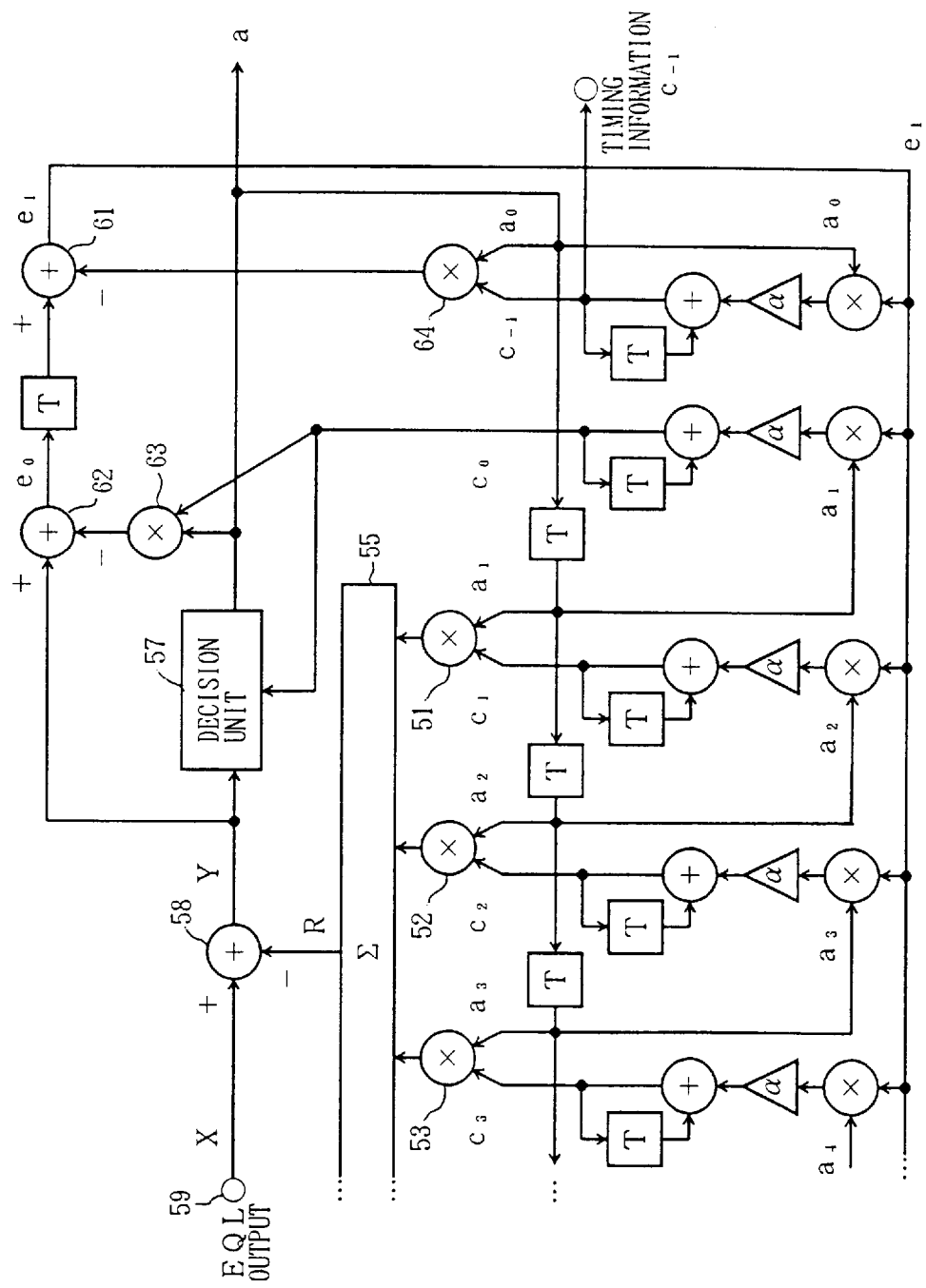
FIG. 6 is a block diagram of a conventional decision feedback equalization circuit.
Figure 7:
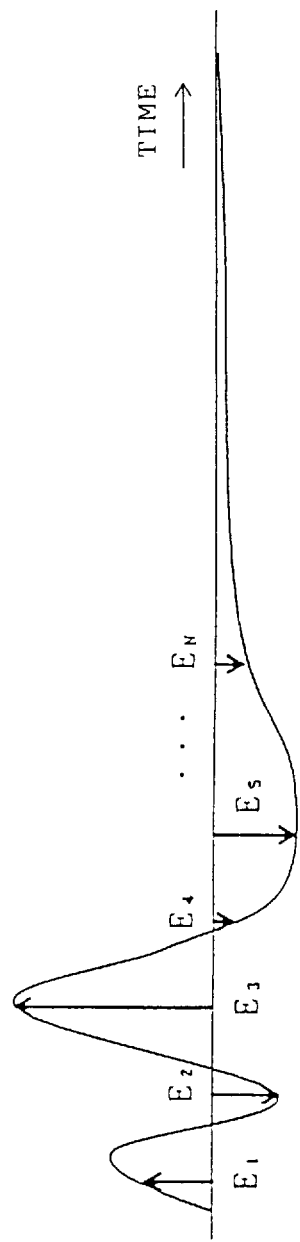
FIG. 7 shows an isolation wave response of an echo.
Figure 8:
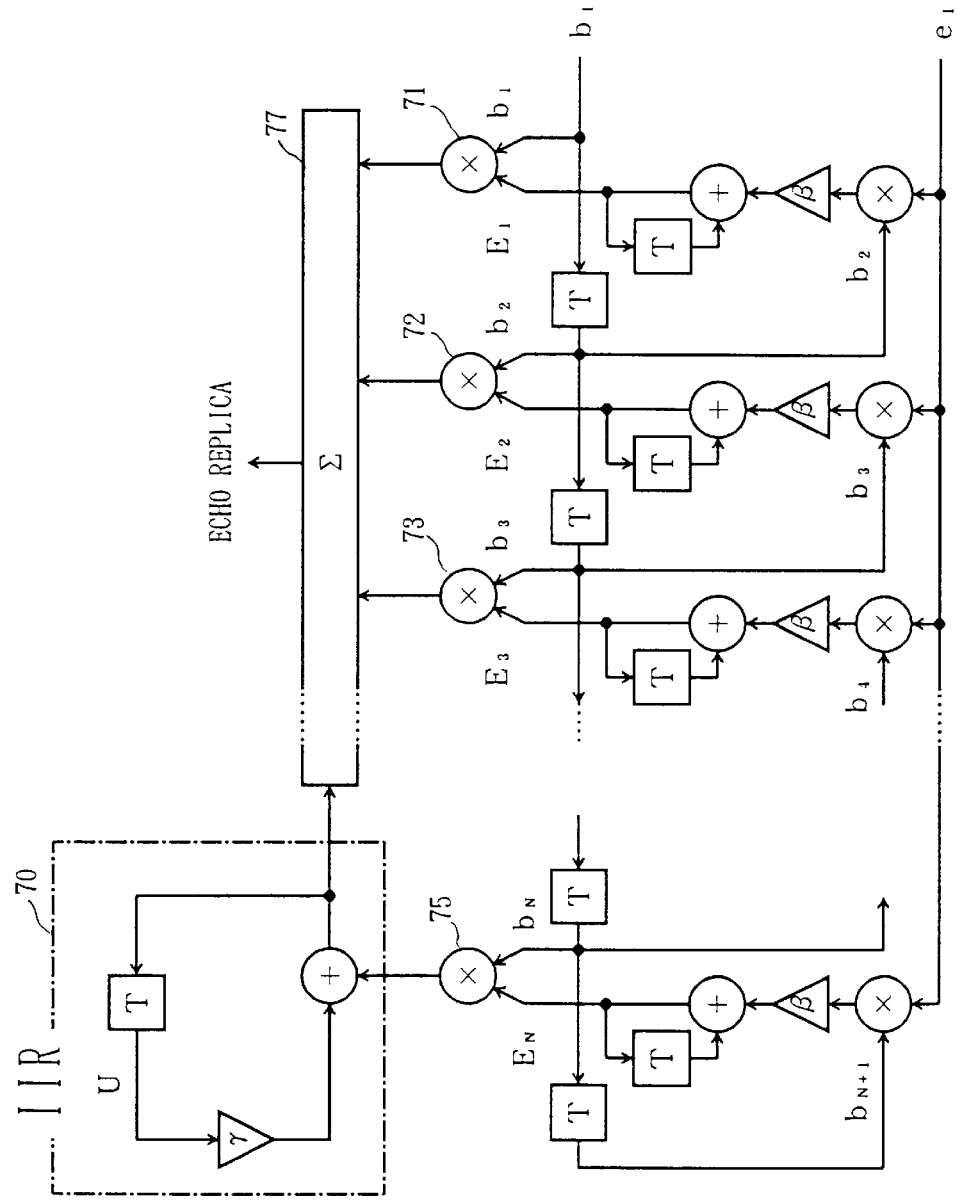
FIG. 8 shows a block diagram of the conventional echo canceler.
Figure 9:
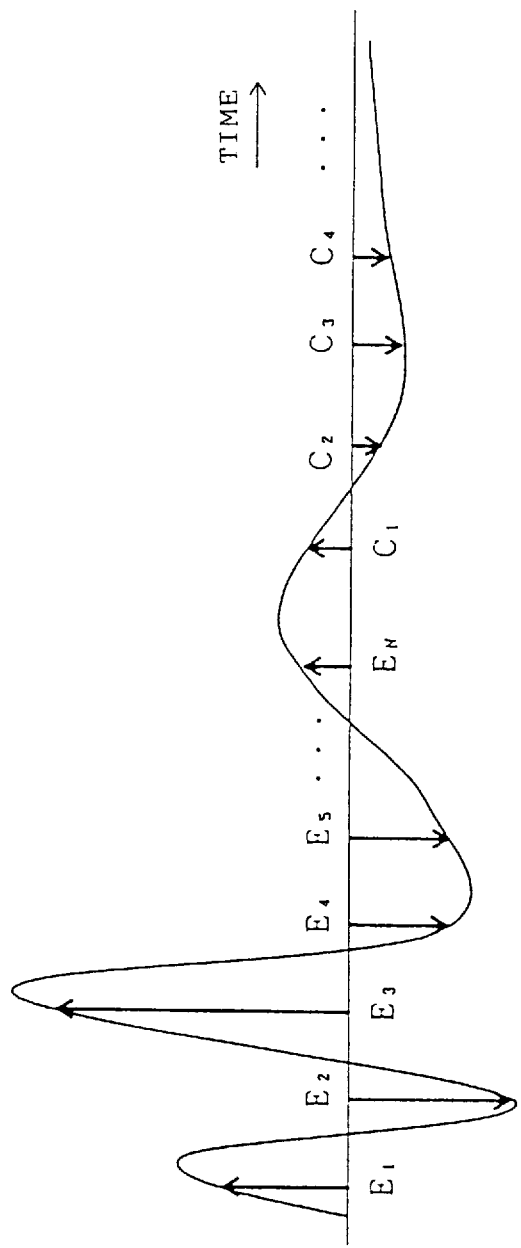
FIG. 9 shows an isolation wave response of an echo.

Therefore, the echo canceler training is conducted such that the selector 132 in the decision feedback equalizer 114 selects the final symbol $b_N$ output from the echo canceler 110 and the post-cursors $C_1$–$C_N$ generated in the decision feed-back equalizer 114 are used. Since the IIR operator 170 and the circuit loss equalization filter 112 of the echo canceler 110 hinder the adaptive operation using the post-cursors $C_1$–$C_N$ generated in the decision feedback equalizer 114, a control signal having a state 0 is supplied to the AND circuit 190 via a terminal 196 and the switch 126 is closed so as to halt the operation of the IIR operator 170 and the circuit loss equalization filter 112. As a result, the post-cursors $C_1$–$C_N$ generated in the decision feedback equalizer 114 can provide a simulation of the isolated wave, shown in FIG. 9, of the echo response after the tap coefficient $E_N$.

As shown in FIG. 13, in the echo canceler training sequence, the post-cursors $C_1$–$C_N$ are updated by rewriting the unit delay elements that store the respective post-cursors $C_1$–$C_N$. In the received signal detection sequence, the main cursor $C_0$ is updated by rewriting the unit delay element 144 that store the main cursor $C_0$. Such an arrangement ensures that satisfactory protection in the received signal detection is provided against possible cases where an echo that remains uncanceled with an extension of the tap length of the echo canceler. A residual echo that refuses to be canceled are low-frequency components which increase when the convolution transmission symbol exhibits a positive deviation or a negative deviation. Otherwise, the residual echo remains at a low level. Therefore, the signal can be successfully detected as long as the average power of the residual components can be determined. The power of the residual components can be determined by updating the main cursor $C_0$ because, when the coefficient $C_0$ alone is used to determine the reception symbol, determine the residual error by mathematical operation, and update the coefficients by mathematical operation, the main cursor $C_0$ is consequently updated with a level of the residual echo as a target. If the updating step size α is set to a satisfactorily small level, the detection is not in pursuit of a temporary increase in the residual error due to a deviation in the transmission symbol. Thereby, a strong protection prior to the received signal detection is available.

In the received signal detection sequence upon a cold start, only the main cursor $C_0$ is subject to coefficient updating operation while the echo cancellation operation is being performed. The coefficient updating is monitored by the level decision unit 180 in the received signal detection circuit 120. Upon arrival of the training random signal SN2, the value of the main cursor $C_0$ increases until it exceeds the threshold of the decision unit 180 in the received signal detection circuit 120, resulting in a detection of the received signal. The next training sequence is then executed. The main cursor $C_0$ can be used as an indicator indicating an average signal power of the residual echo that remains after the echo cancellation and of the arriving training random signal SN2. Therefore, the level decision unit 180 in the received signal detection circuit 120 has its threshold set in such a manner that the received signal level carried over the maximum length of the line can be detected.

In the echo canceler training sequence and the reception system training sequence upon the next cold start, the symbol $a_0$ is selected and input to the unit delay element 138 which operates as a post-cursor convolution register and an updating symbol register, because the arrival of the received signal is successfully detected in the previous received signal detection sequence. The operation of the echo canceler 110, the IIR operator 170 and the equalization filter 112 is resumed so that training such as received signal waveform equalization and timing regeneration are executed. Since the post-cursors are used as tap coefficients of the echo canceler until the received signal detection sequence, smooth leading-in of the coefficients without being affected by the previous sequence can be performed by resetting the tap coefficients before the training, with the tap coefficients being used to generate the intersymbol interferences, is started.

Figure 14:
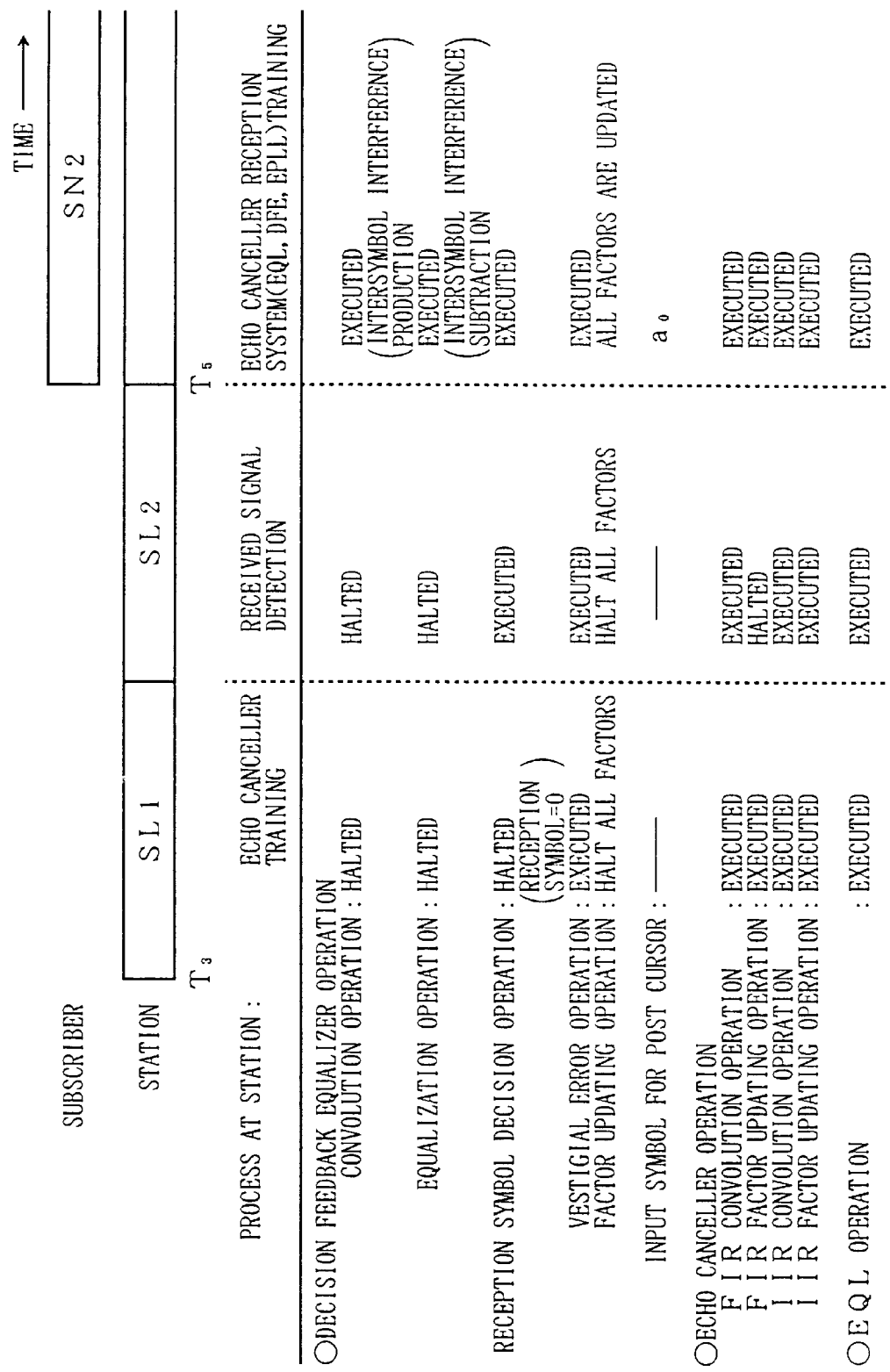
FIG. 14 shows a sequence of processes performed in the line termination circuit of the station upon a warm start.

FIG. 14 shows a sequence of processes performed in the line termination circuit of the station upon a warm start. In the echo canceler training sequence executed upon an output of the training random signal SL1 from the station, the decision feedback equalizer 114 is halted so that only the echo canceler 110 retraining is executed.

In the received signal detection sequence executed upon an output of the training random signal SL2, the decision unit 157 performs the reception symbol determination. However, the post-cursor $C_1$–$C_M$ convolution and equalization operations are halted. As a result of the training of the echo canceler 110, the residual echo that remains after the echo cancellation is smaller in level than the main cursor $C_0$. If the level of the main cursor $C_0$ is exceeded, the reception symbol determination is impossible so that the communication is disabled. For this reason, monitoring by the ±3 detection unit 184 to determine whether the symbol a (decision result) is ±3 or −3 is tantamount to detecting the received signal with a level twice as high as the main cursor $C_0$ being used as a threshold level. Thus, a successful received signal detection is ensured.

In a warm start, the received signal level (main cursor $C_0$) in the previous communication is known and is used as a reference in the received signal detection. The received signal can be successfully detected even if the echo cancellation characteristic more or less deteriorates in a near-distance transmission. By halting the convolution, equalization and coefficient updating operations of the decision feedback equalizer 114, the signal Y is not affected by the post-cursor convolution and the equalization operation. A level twice as high as the main cursor $C_0$ can be used as a threshold in the determination of the residual echo that remains after the echo cancellation, ensuring a satisfactory margin.

In the echo canceler training sequence and the reception system training sequence in the next warm start, retraining such as the received signal waveform equalization and the timing regeneration similar to the corresponding operations in a cold start are executed. Since the post-cursors retain the received signal intersymbol interferences in the previous communication, no resetting operation is carried out.

The present invention is not limited to the above described embodiments, and variations and modifications may be made without departing from the scope of the present invention.

What is claimed is:

1. A line termination circuit for an access line, comprising:

an echo canceler for generating an echo replica from transmitted data;

a subtracter for subtracting said echo replica from a signal supplied via the access line;

an equalization filter for equalizing a circuit loss of the access line;

a decision feedback equalizer for equalizing an output signal from said equalization filter so as to determine a reception symbol; and a received signal detection circuit for detecting a received signal, wherein a post-cursor tap coefficient of said decision feedback equalizer is used as a tap coefficient for said echo canceler during a cold-start echo canceler training period in which communication startup training is started in an initial start and during a cold-start received signal detection period.

2. The line termination circuit for an access line as claimed in claim 1, wherein an infinite impulse response operation of said echo canceler is halted during said cold-start echo canceler training period and said cold-start received signal detection period.

3. The line termination circuit for an access line as claimed in claim 1, wherein a signal path bypasses said equalization filter during said cold-start echo canceler training period and said cold-start received signal detection period.

4. The line termination circuit for an access line as claimed in claim 1, wherein the post-cursor tap coefficient of said decision feedback equalizer is reset when the received signal is detected by said received signal detection circuit.

5. The line termination circuit for an access line as claimed in claim 1, wherein said received signal detection circuit detects the received signal by comparing a main cursor tap coefficient output from said decision feedback equalizer during the cold-start received signal detection period with a threshold value.

6. The line termination circuit for an access line as claimed in claim 5, wherein said threshold value of said received signal detection circuit is a fixed value that enables a level of a signal transmitted over a maximum length of the access line to be detected.

7. The line termination circuit for an access line as claimed in claim 1, wherein the received signal is detected when the reception symbol determined by said decision feedback equalizer is found to be a predetermined value during a warm-start received signal detection period in which communication startup training is started while a filter factor is held.

8. The line termination circuit for an access line as claimed in claim 7, wherein convolution, equalization and tap coefficient updating operation of said decision feedback equalizer are halted during a warm-start echo canceler training period and the warm-start received signal detection period.

* * * * *

UNITED STATES PATENT AND TRADEMARK OFFICE
CERTIFICATE OF CORRECTION

PATENT NO.   : 5,841,809
DATED        : NOVEMBER 24, 1998
INVENTOR(S)  : Nobukazu KOIZUMI ,et al.

It is certified that error appears in the above-indentified patent and that said Letters Patent is hereby corrected as shown below:

On the title page, item [73] should be corrected as follows:

delete"Limimited" and insert --Limited--.

Signed and Sealed this

Sixth Day of July, 1999

Attest:

Q. TODD DICKINSON

Attesting Officer      Acting Commissioner of Patents and Trademarks